US009035303B2

(12) United States Patent
Miyamoto et al.

(10) Patent No.: US 9,035,303 B2
(45) Date of Patent: May 19, 2015

(54) SEMICONDUCTOR DEVICE AND METHOD FOR MANUFACTURING SAME

(71) Applicant: Sharp Kabushiki Kaisha, Osaka-shi, Osaka (JP)

(72) Inventors: Tadayoshi Miyamoto, Osaka (JP); Kazuatsu Ito, Osaka (JP); Mitsunobu Miyamoto, Osaka (JP); Yutaka Takamaru, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/389,810

(22) PCT Filed: Apr. 1, 2013

(86) PCT No.: PCT/JP2013/059885
§ 371 (c)(1),
(2) Date: Oct. 1, 2014

(87) PCT Pub. No.: WO2013/151002
PCT Pub. Date: Oct. 10, 2013

(65) Prior Publication Data
US 2015/0069381 A1 Mar. 12, 2015

(30) Foreign Application Priority Data

Apr. 6, 2012 (JP) .................................. 2012-087023

(51) Int. Cl.
*H01L 29/12* (2006.01)
*H01L 29/786* (2006.01)
(Continued)

(52) U.S. Cl.
CPC ...... *H01L 29/7869* (2013.01); *H01L 29/41733* (2013.01); *H01L 29/66969* (2013.01); *H01L 29/78606* (2013.01)

(58) Field of Classification Search
CPC ............ H01L 29/7869; H01L 27/3248; H01L 27/3258; H01L 2924/13069
USPC ...................... 257/43, 449, E33.064; 438/104
See application file for complete search history.

(56) References Cited

U.S. PATENT DOCUMENTS 7,453,087 B2 * 11/2008 Iwasaki ........................... 257/59
7,468,304 B2 * 12/2008 Kaji et al. ..................... 438/308
(Continued)

FOREIGN PATENT DOCUMENTS

JP 2011-053443 A 3/2011
JP 2011-091279 A 5/2011
(Continued)

*Primary Examiner* — Earl Taylor
(74) *Attorney, Agent, or Firm* — Keating & Bennett, LLP

(57) ABSTRACT

This semiconductor device (100A) includes: a gate electrode (3) formed on a substrate (2); a gate insulating layer (4) formed on the gate electrode; an oxide layer (50) which is formed on the gate insulating layer and which includes a semiconductor region (51) and a conductor region (55); source and drain electrodes (6s, 6d) electrically connected to the semiconductor region; a protective layer (11) formed on the source and drain electrodes; and a transparent electrode (9) formed on the protective layer. At least part of the transparent electrode overlaps with the conductor region with the protective layer interposed between them. The upper surface of the conductor region contacts with a reducing insulating layer (61) with the property of reducing an oxide semiconductor included in the oxide layer. The reducing insulating layer is out of contact with the channel region of the semiconductor region.

8 Claims, 6 Drawing Sheets

(51) Int. Cl.
*H01L 29/417* (2006.01)
*H01L 29/66* (2006.01)

(56) References Cited

U.S. PATENT DOCUMENTS

| | | | | |
|---|---|---|---|---|
| 8,901,556 | B2* | 12/2014 | Okazaki et al. | 257/43 |
| 2007/0024187 | A1* | 2/2007 | Shin et al. | 313/504 |
| 2007/0046191 | A1* | 3/2007 | Saito | 313/506 |
| 2007/0054507 | A1* | 3/2007 | Kaji et al. | 438/795 |
| 2007/0152217 | A1* | 7/2007 | Lai et al. | 257/59 |
| 2009/0068773 | A1* | 3/2009 | Lai et al. | 438/23 |
| 2010/0065844 | A1* | 3/2010 | Tokunaga | 257/43 |
| 2011/0003429 | A1* | 1/2011 | Oikawa et al. | 438/104 |
| 2011/0050551 | A1 | 3/2011 | Ota et al. | |
| 2011/0114945 | A1* | 5/2011 | Yamazaki et al. | 257/43 |
| 2011/0127518 | A1* | 6/2011 | Jung et al. | 257/43 |
| 2011/0216566 | A1* | 9/2011 | Kamata | 363/127 |
| 2012/0138922 | A1* | 6/2012 | Yamazaki et al. | 257/43 |

FOREIGN PATENT DOCUMENTS

| | | |
|---|---|---|
| JP | 2012-134475 A | 7/2012 |
| WO | 2013/150981 A1 | 10/2013 |

* cited by examiner (a)

(b)

(a)

(b)

(c)

SEMICONDUCTOR DEVICE AND METHOD FOR MANUFACTURING SAME

TECHNICAL FIELD

The present invention relates to a semiconductor device which has been formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be simply referred to herein as "TFTs"), each of which is provided for an associated one of pixels. An active-matrix substrate including TFTs as switching elements is called a "TFT substrate".

As for TFTs, a TFT which uses an amorphous silicon film as its active layer (and will be referred to herein as an "amorphous silicon TFT") and a TFT which uses a polysilicon film as its active layer (and will be referred to herein as a "polysilicon TFT") have been used extensively.

Recently, people have proposed that an oxide semiconductor be used as a material for the active layer of a TFT instead of amorphous silicon or polysilicon. Such a TFT will be referred to herein as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

Patent Document No. 1 discloses a method for fabricating a TFT substrate including oxide semiconductor TFTs. According to the method disclosed in Patent Document No. 1, a TFT substrate can be fabricated in a reduced number of manufacturing process steps by forming a pixel electrode with the resistance of the oxide semiconductor layer locally lowered.

Recently, as the definition of liquid crystal display devices and other devices has become higher and higher, a decrease in pixel aperture ratio has become an increasingly serious problem. In this description, the "pixel aperture ratio" refers herein to the ratio of the combined area of pixels (e.g., the combined area of regions which transmit light that contributes to a display operation in a transmissive liquid crystal display device) to the overall display area. In the following description, the "pixel aperture ratio" will be simply referred to herein as an "aperture ratio".

Among other things, a medium to small sized transmissive liquid crystal display device to be used in a mobile electronic device has so small a display area that each of its pixels naturally has a very small area and the aperture ratio will decrease particularly significantly when the definition is increased. On top of that, if the aperture ratio of a liquid crystal display device to be used in a mobile electronic device decreases, the luminance of the backlight needs to be increased to achieve an intended brightness, thus causing an increase in power dissipation, too, which is also a problem.

To achieve a high aperture ratio, the combined area occupied by a TFT, a storage capacitor, and other elements of a non-transparent material in each pixel may be decreased. However, naturally, the TFT and the storage capacitor should have their minimum required size to perform their function. When oxide semiconductor TFTs are used as TFTs, the TFTs can have a smaller size than when amorphous silicon TFTs are used, which is advantageous. It should be noted that in order to maintain a voltage that has been applied to the liquid crystal layer of a pixel (which is called a "liquid crystal capacitor" electrically), the "storage capacitor" is provided electrically in parallel with the liquid crystal capacitor. In general, at least a portion of the storage capacitor is arranged so as to overlap with the pixel.

CITATION LIST

Patent Literature

Patent Document No. 1: Japanese Laid-Open Patent Publication No. 2011-91279

SUMMARY OF INVENTION

Technical Problem

However, demands for increased aperture ratios are too huge to satisfy just by using oxide semiconductor TFTs. Meanwhile, as the prices of display devices have become lower and lower year after year, development of a technology for manufacturing high-definition, high-aperture-ratio display devices at a lower cost is awaited.

Thus, a primary object of the present invention is to provide a TFT substrate which can be fabricated by a simpler process and which can contribute to realizing a display device with higher definition and a higher aperture ratio than conventional ones and also provide a method for fabricating such a TFT substrate.

Solution to Problem

A semiconductor device according to an embodiment of the present invention includes: a substrate; a gate electrode formed on the substrate; a gate insulating layer formed on the gate electrode; an oxide layer which is formed on the gate insulating layer and which includes a semiconductor region and a conductor region, wherein the semiconductor region overlaps at least partially with the gate electrode with the gate insulating layer interposed between them; source and drain electrodes electrically connected to the semiconductor region; a protective layer formed on the source and drain electrodes; and a transparent electrode formed on the protective layer. At least part of the transparent electrode overlaps with the conductor region with the protective layer interposed between them. The upper surface of the conductor region contacts with a reducing insulating layer with the property of reducing an oxide semiconductor included in the oxide layer. And the reducing insulating layer is out of contact with a channel region of the semiconductor region.

In one embodiment, the source and drain electrodes are formed on the semiconductor region, and a portion of the drain electrode is formed on the reducing insulating layer.

In one embodiment, the source and drain electrodes is formed under the semiconductor region.

In one embodiment, the semiconductor device further includes a source-gate connecting portion, which includes: a gate connecting layer formed out of the same conductive film as the gate electrode; a source connecting layer formed out of the same conductive film as the source electrode; and a transparent connecting layer formed out of the same transparent conductive film as the transparent electrode. The source connecting layer and the gate connecting layer are electrically connected together via the transparent connecting layer.

In one embodiment, the oxide layer includes In, Ga and Zn.

A method for fabricating a semiconductor device according to an embodiment of the present invention includes the steps of: (A) providing a substrate; (B) forming a gate electrode and a gate insulating layer on the substrate; (C) forming an oxide semiconductor film on the gate insulating layer, forming a reducing insulating film with the property of reducing an oxide semiconductor included in the oxide semiconductor film on the oxide semiconductor film, and patterning the oxide semiconductor film and the reducing insulating film using a single photomask, thereby forming an oxide semiconductor layer and a reducing insulating layer which contacts with a portion of the upper surface of the oxide semiconductor layer, so that a portion of the oxide semiconductor layer that contacts with the reducing insulating layer has its resistance lowered to turn into a conductor region and another portion of the oxide semiconductor layer that has not had its resistance lowered becomes a semiconductor region; and (D) forming, either before or after the step (C), source and drain electrodes to be electrically connected to the semiconductor region.

In one embodiment, the step (D) is performed after the step (C), the source and drain electrodes are formed on the semiconductor region, and a portion of the drain electrode is formed on the reducing insulating layer.

In one embodiment, the step (D) is performed before the step (C), and the oxide semiconductor layer is formed on the source and drain electrodes.

Advantageous Effects of Invention

Embodiments of the present invention provide a TFT substrate which can be fabricated by a simpler process and which can contribute to realizing a display device with higher definition and a higher aperture ratio than conventional ones and also provide a method for fabricating such a TFT substrate.

DESCRIPTION OF EMBODIMENTS

Figure 1:
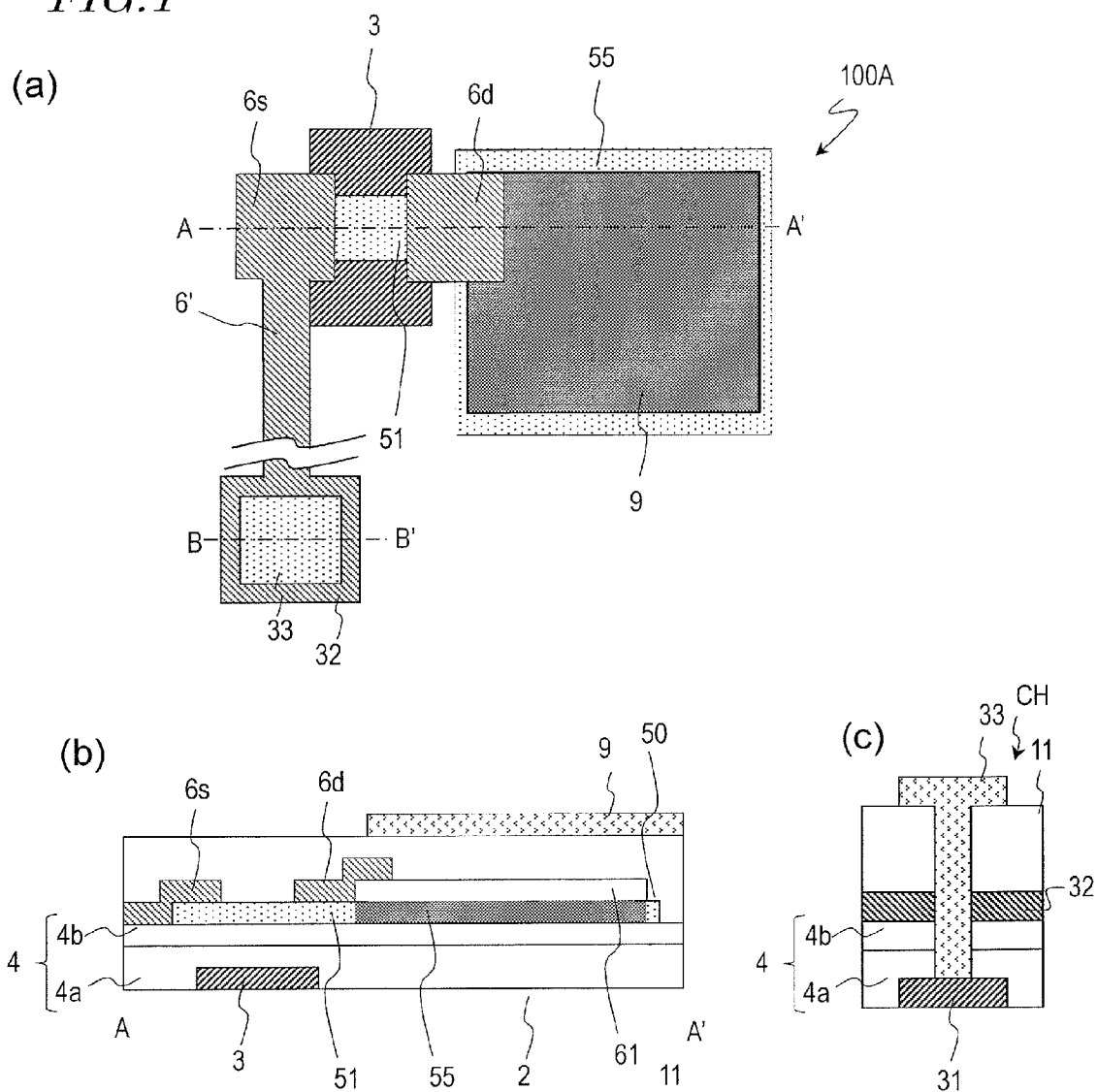
[FIG. 1] (a) is a schematic plan view illustrating a TFT substrate 100A according to an embodiment of the present invention. (b) is a schematic cross-sectional view of the TFT substrate 100A as viewed on the plane A-A' shown in (a). And (c) is a schematic cross-sectional view of the TFT substrate 100A as viewed on the plane B-B' shown in (a).

Hereinafter, a semiconductor device as an embodiment of the present invention will be described with reference to the accompanying drawings. The semiconductor device of this embodiment includes a thin-film transistor with an active layer made of an oxide semiconductor (which will be referred to herein as an "oxide semiconductor TFT"). It should be noted that the semiconductor device of this embodiment just needs to include an oxide semiconductor TFT and is broadly applicable to an active-matrix substrate and various kinds of display devices and electronic devices.

In the following description, a semiconductor device as an embodiment of the present invention will be described as being applied to an oxide semiconductor TFT for use in a liquid crystal display device.

FIG. 1(a) is a schematic plan view illustrating a TFT substrate 100A according to this embodiment. FIG. 1(b) is a schematic cross-sectional view of the semiconductor device (TFT substrate) 100A as viewed on the plane A-A' shown in FIG. 1(a). And FIG. 1(c) is a schematic cross-sectional view of the semiconductor device (TFT substrate) 100A as viewed on the plane B-B' shown in FIG. 1(a).

This TFT substrate 100A includes a substrate 2, a gate electrode 3 formed on the substrate 2, a gate insulating layer 4 formed on the gate electrode 3, and an oxide layer (which will be sometimes referred to herein as an "oxide semiconductor layer") 50 which is formed on the gate insulating layer 4 and which includes a semiconductor region 51 and a conductor region 55. The semiconductor region 51 overlaps at least partially with the gate electrode 3 with the gate insulating layer 4 interposed between them. The TFT substrate 100A further includes source and drain electrodes 6s, 6d electrically connected to the semiconductor region 51, a protective layer 11 formed on the source and drain electrodes 6s, 6d, and a transparent electrode 9 formed on the protective layer 11. At least part of the transparent electrode 9 overlaps with the conductor region 55 with the protective layer 11 interposed between them. Or at least part of the transparent electrode 9 may overlap with the conductor region 55 with the protective layer 11 and a reducing insulating layer 61 interposed between them as shown in FIG. 1(b). The upper surface of the conductor region 55 contacts with the reducing insulating layer 61 with the property of reducing an oxide semiconductor included in the semiconductor region 51. The reducing insulating layer 61 does not contact with a channel region of the semiconductor region 51. The protective layer 11 is formed on the reducing insulating layer 61.

In this TFT substrate 100A, at least a part of the transparent electrode 9 overlaps with the conductor region 55 with the protective layer 11 interposed between them. As a result, a storage capacitor is formed in the region where they overlap with each other. Accordingly, this storage capacitor of the TFT substrate 100A is transparent (i.e., can transmit visible light), and does not decrease the aperture ratio. Consequently, this TFT substrate 100A can have a higher aperture ratio than a conventional TFT substrate with a storage capacitor including a non-transparent electrode which is formed out of a metal film (such as a gate metal layer or a source metal layer). On top of that, since the aperture ratio is not decreased by the storage capacitor, the capacitance value of the storage capacitor (i.e., the area of the storage capacitor) can be increased as needed, which is also advantageous.

In addition, in this TFT substrate 100A, the source and drain electrodes 6s and 6d are formed on the semiconductor region 51. A portion of the drain electrode 6d is suitably located on the reducing insulating layer 61. By adopting such a configuration, the conductor region 55 can be extended to almost reach an end portion of the drain electrode 6d which is located over the semiconductor region 51. As a result, the TFT substrate 100A can have a higher aperture ratio than the TFT substrate disclosed in Patent Document No. 1.

The present inventors discovered that when a metal line such as a source electrode 6s or a drain electrode 6d was formed so as to contact with an oxide semiconductor layer, the closeness of contact between the metal line and the oxide semiconductor layer was poor and the larger the area of contact between the oxide semiconductor layer and the metal line, the more easily the metal line peeled off the oxide semiconductor layer. Such a problem is described in detail in PCT/JP2013/059615, for example. A TFT substrate 100A can be fabricated by the manufacturing process to be described later. According to the manufacturing process to be described later, the area of contact between the semiconductor region 51 of the oxide layer 50 and the source and drain electrodes 6s, 6d can be as small as possible, and the source and drain electrodes 6s and 6d does not easily peel off the semiconductor region 51, which is advantageous.

The conductor region 55 has a lower electrical resistance than the semiconductor region 51. The electrical resistance of the conductor region 55 may be 100 kΩ/□ or less, for example, and is suitably 10 kΩ/□ or less. As will be described in detail later, the conductor region 55 may be formed by locally lowering the resistance of an oxide film to be a semiconductor region 51. Although it depends on what processing method is taken to lower the resistance, the conductor region 55, for example, may be doped more heavily with a dopant (such as boron) than the semiconductor region 51 is.

Optionally, the TFT substrate 100A may further include a source-gate connecting portion to connect together a portion of a source line layer which is formed out of the same conductive film as the gate electrode 3 and a portion of a line layer which is formed out of the same conductive film as the source electrode 6s.

As shown in FIG. 1(c), the source-gate connecting portion includes a gate connecting layer 31 which is formed out of the same conductive film as the gate electrode 3, a source connecting layer 32 which is formed out of the same conductive film as the source electrode 6s, and a transparent connecting layer 33 which is formed out of the same transparent conductive film as the transparent electrode 9. The source connecting layer 32 and the gate connecting layer are electrically connected together via the transparent connecting layer 33. If the transparent connecting layer 33 is used as an extended line to electrically connect the source connecting layer 32 and the gate connecting layer 31 together, a TFT substrate in which a driver circuit forms an integral part can be formed. As a result, a display device of high quality can be fabricated.

In the example illustrated in FIG. 1, the gate insulating layer 4 is extended onto the gate connecting layer 31. The transparent connecting layer 33 is arranged to contact with the gate connecting layer 31 inside a hole which has been cut through the protective layer 11, the source connecting layer 32 and the gate insulating layer 4.

Hereinafter, the respective components of this TFT substrate 100A will be described in detail one by one.

The substrate 2 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 2 may also be a silicon substrate.

The gate electrode 3 is electrically connected to a gate line (not shown). The gate electrode 3, the gate connecting layer 31 and the gate line may have a multilayer structure, of which the upper layer is a W (tungsten) layer and the lower layer is a TaN (tantalum nitride) layer, for example. Alternatively, the gate electrode 3 and the gate line may also have a multilayer structure consisting of Mo (molybdenum), Al (aluminum) and Mo layers or may even have a single-layer structure, a double layer structure, or a multilayer structure consisting of four or more layers. Still alternatively, the gate electrode 3a may be made of an element selected from the group consisting of Cu (copper), Al, Cr (chromium), Ta (tantalum), Ti (titanium), Mo and W or an alloy or metal nitride which is comprised mostly of any of these elements. The gate electrode 3 may have a thickness of approximately 420 nm, for example. The thickness of the gate electrode 3 suitably falls within the range of about 50 nm to about 600 nm, for example.

The gate insulating layer 4 includes an lower gate insulating layer 4a and an upper gate insulating layer 4b. The upper gate insulating layer 4b which contacts with the semiconductor region 51 suitably includes an oxide insulating layer. If the oxide insulating layer contacts with the semiconductor region 51, oxygen included in the oxide insulating layer will be supplied to the semiconductor region 51, thus preventing oxygen deficiencies in the semiconductor region 51 from deteriorating the properties of the semiconductor. The upper gate insulating layer 4b may be an $SiO_2$ (silicon dioxide) layer, for example. The lower gate insulating layer 4a may be an $SiN_x$ (silicon nitride) layer, for example. In this embodiment, the lower gate insulating layer 4a may have a thickness of approximately 325 nm, the upper gate insulating layer 4b may have a thickness of approximately 50 nm, and the gate insulating layer 4 may have an overall thickness of approximately 375 nm, for example. Alternatively, the gate insulating layer 4 may also be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the gate insulating layer 4 suitably falls within the range of about 50 nm to about 600 nm. To prevent dopants from diffusing from the substrate 2, the lower gate insulating layer 4a is suitably made of $SiN_x$ or $SiN_xO_y$ (silicon nitride oxide, where x>y). Moreover, to prevent the semiconductor properties of the semiconductor region 51 from deteriorating, the upper gate insulating layer 4b is suitably made of either $SiO_2$ or $SiO_xN_y$ (silicon oxynitride, where x>y). Furthermore, to form a dense gate insulating layer 4 which causes little gate leakage current at low temperatures, the gate insulating layer 4 is suitably formed using a rare gas of Ar (argon), for example.

The oxide layer 50 may be an In—Ga—Zn—O based semiconductor layer including In (indium), Ga (gallium) and Zn (zinc) at a ratio of 1:1:1. The ratio of In, Ga and Zn may be selected appropriately. A TFT including an In—Ga—Zn—O based semiconductor layer has high mobility (which is more than 20 times as high as that of an a-Si TFT) and low leakage current (which is less than one hundredth of that of an a-Si TFT).

The oxide layer 50 does not have to be an In—Ga—Zn—O based semiconductor layer, but may also be formed out of any other oxide semiconductor film. Examples of other oxide semiconductor films include a Zn—O based (ZnO) semiconductor film, an In—Zn—O based (IZO™) semiconductor film, a Zn—Ti—O based (ZTO) semiconductor film, a Cd—Ge—O based semiconductor film, a Cd—Pb—O based semiconductor film, a CdO (cadmium oxide) film, an Mg—Zn—O based semiconductor film, an In—Sn—Zn—O based semiconductor (such as $In_2O_3$—$SnO_2$—ZnO) film and an In—Ga—Sn—O based semiconductor film.

Furthermore, the oxide layer 50 may also be made of ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all. An amorphous oxide semiconductor film is suitably used as the oxide layer 50, because the semiconductor device can be fabricated at a low temperature and can achieve high mobility in that case. The oxide layer 50 may have a thickness of about 50 nm, for example. The thickness of the oxide layer 50 suitably falls within the range of about 30 nm to about 100 nm, for example.

Optionally, a crystalline In—Ga—Zn—O based semiconductor film may be used. In that case, a crystalline In—Ga—Zn—O based semiconductor, of which the c axis is substantially perpendicular to the layer plane, is suitably used. The crystal structure of such an In—Ga—Zn—O based semiconductor is disclosed, for example, in Japanese Laid-Open Patent Publication No. 2012-134475, the entire disclosure of which is hereby incorporated by reference.

The source electrode 6s is electrically connected to a source line 6'. The source line 6' and source and drain electrodes 6s and 6d may have a multilayer structure comprised of Ti, Al and Ti layers, for example. Alternatively, the source line 6' and source and drain electrodes 6s and 6d may also have a multilayer structure comprised of Mo, Al and Mo layers or may even have a single-layer structure, a double layer structure or a multilayer structure consisting of four or more layers. Furthermore, the source line 6' and source and drain electrodes 6s and 6d may also be made of an element selected from the group consisting of Al, Cr, Ta, Ti, Mo and W, or an alloy or metal nitride comprised mostly of any of these elements. The source line 6' and source and drain electrodes 6s and 6d may have a thickness of about 350 nm, for example. The thickness of the source line 6' and source and drain electrodes 6s and 6d suitably falls within the range of about 50 nm to about 600 nm, for example.

The protective layer 11 is arranged between the conductor region 55 and the transparent electrode 9 to form a storage capacitor there. If a storage capacitor is formed of the transparent electrode 9, the transparent conductor region 55 and the transparent protective layer 11 in this manner, a display panel with a high aperture ratio can be fabricated when this TFT substrate 100A is used to make a display panel.

Figure 2:
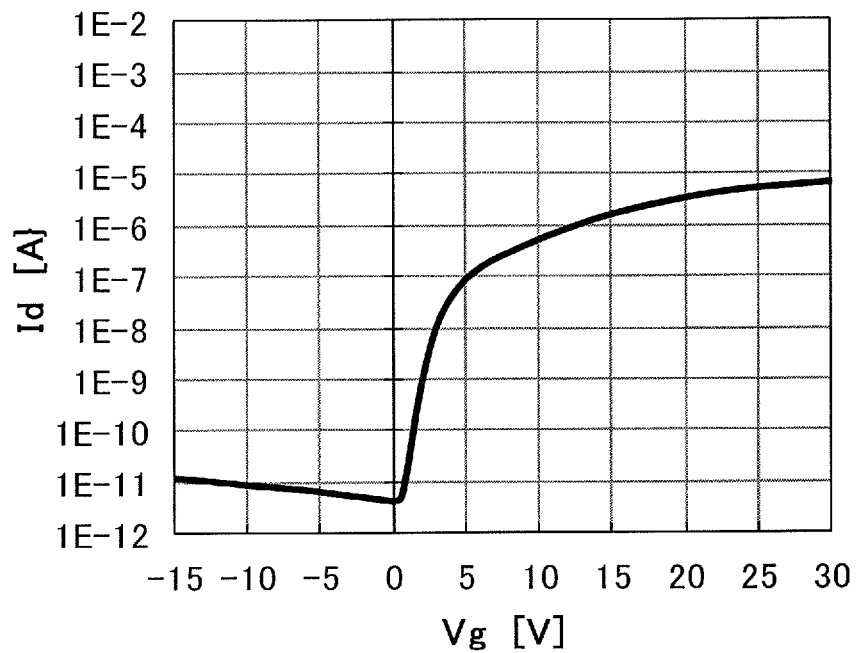
[FIG. 2] (a) is a graph showing a gate voltage (Vg)-drain current (Id) curve of an oxide semiconductor TFT having a configuration in which an oxide insulating layer contacts with an oxide semiconductor layer. (b) is a graph showing a gate voltage (Vg)-drain current (Id) curve of an oxide semiconductor TFT having a configuration in which a reducing insulating layer 61 contacts with an oxide semiconductor layer.
Figure 2:
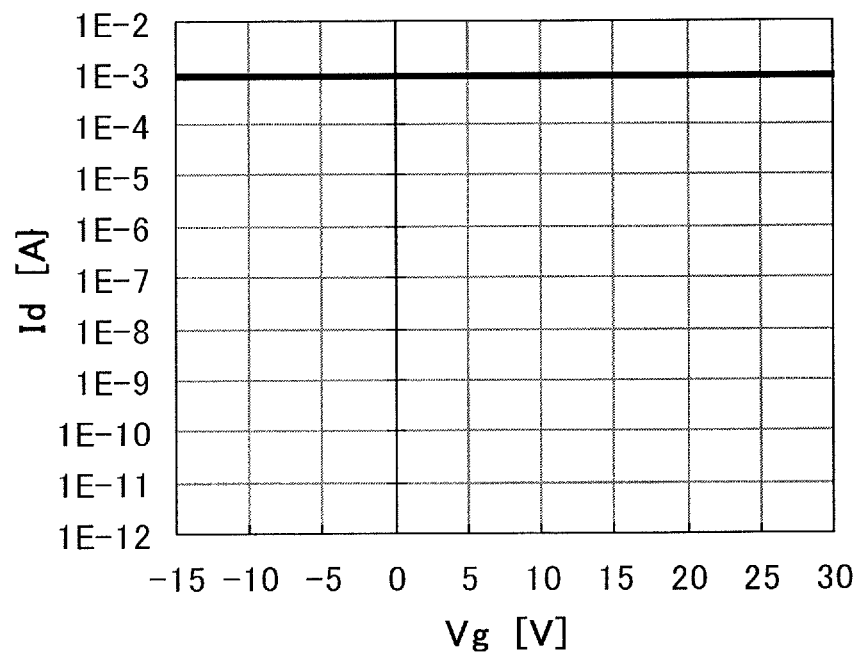

Next, the reducing insulating layer 61 will be described with reference to FIG. 2. When in contact with an oxide semiconductor layer, the reducing insulating layer 61 has the function of lowering its electrical resistance. FIG. 2(a) is a graph showing a gate voltage (Vg)-drain current (Id) curve of an oxide semiconductor TFT having a configuration in which an oxide insulating layer (of $SiO_2$, for example) is formed so as to contact with the entire lower surface of an oxide semiconductor layer (active layer). On the other hand, FIG. 2(b) is a graph showing a gate voltage (Vg)-drain current (Id) curve of an oxide semiconductor TFT having a configuration in which a reducing insulating layer (of $SiN_x$, for example) is formed so as to contact with the entire lower surface of an oxide semiconductor layer (active layer).

As can be seen from FIG. 2(a), an oxide semiconductor TFT in which an oxide insulating layer contacts with an oxide semiconductor layer has a good TFT characteristic.

On the other hand, as can be seen from FIG. 2(b), an oxide semiconductor TFT in which a reducing insulating layer contacts directly with an oxide semiconductor layer does not have a TFT characteristic, and the oxide semiconductor layer is turned into a conductor by the reducing insulating layer.

As can be seen from the foregoing description, if the reducing insulating layer 61 contacts with the oxide semiconductor layer, the electrical resistance of the oxide semiconductor layer decreases. This is probably because the reducing insulating layer 61 will include a lot of hydrogen and will reduce the semiconductor region 51 by contacting with the semiconductor region 51, thus lowering the resistance of the oxide semiconductor film. That is why if such a reducing insulating layer 61 is formed to contact with the semiconductor region 51, the resistance of the semiconductor region 51 can be lowered even without performing any special resistance lowering process (such as a hydrogen plasma treatment). In the manufacturing process of the TFT substrate 100A of this embodiment, if the reducing insulating layer 61 is arranged to contact with a portion of the oxide semiconductor film, an electrode can be formed with the resistance of the oxide semiconductor film lowered partially. On the other hand, the rest of the oxide semiconductor film, of which the resistance has not been lowered, can be used as an active layer for TFTs. Consequently, the manufacturing process can be simplified and the manufacturing cost can be cut down.

The reducing insulating layer 61 may be made of $SiN_x$, for example. An $SiN_x$ film may be deposited as the reducing insulating layer 61 at a substrate temperature of about 100° C. to about 250° C. (e.g., at 220° C.) and with the flow rates adjusted so that the $SiH_4$—$NH_3$ mixed gas flow rate (in sscm) ratio (i.e., the ratio of the $SiH_4$ flow rate to the $NH_3$ flow rate) falls within the range of 4 to 20. The reducing insulating layer 61 may have a thickness of about 100 nm, for example. The thickness of the reducing insulating layer 61 suitably falls within the range of about 50 nm to about 300 nm.

The conductor region 55 and the semiconductor region 51 are formed out of the same oxide film (such as an In—Ga—Zn—O based semiconductor film). By forming the conductor region 55 and the semiconductor region 51 out of the same oxide film, the manufacturing process can be simplified and the manufacturing cost can be cut down.

The transparent electrode 9 is formed out of a transparent conductive film (such as an ITO (indium tin oxide) film or an IZO™ film). The transparent electrode 9 may have a thickness of about 100 nm, for example. The thickness of the transparent electrode 9 suitably falls within the range of about 20 nm to about 200 nm.

Figure 3:
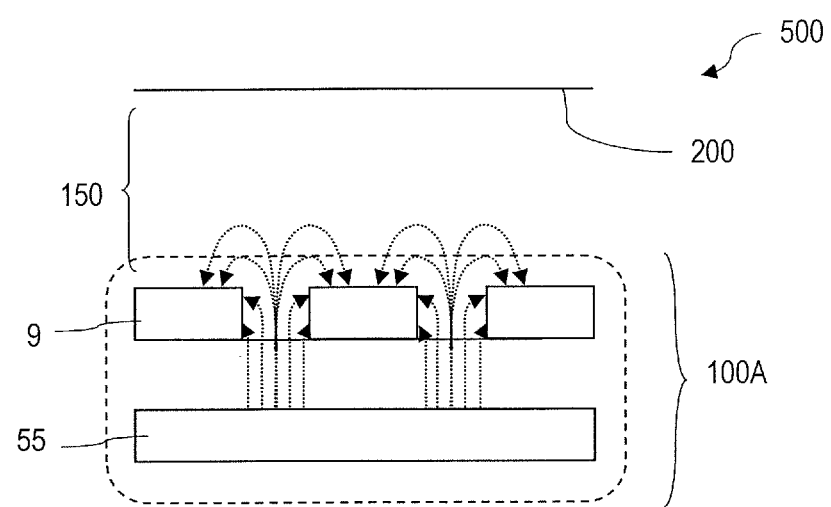
[FIG. 3] A schematic cross-sectional view of a liquid crystal display device 500 as an embodiment of the present invention.

As shown in FIG. 3, the TFT substrate 100A may be used in a fringe field switching (FFS) mode liquid crystal display device 500, for example. In this case, the conductor region 55 that forms the lower layer is used as a pixel electrode (to which a display signal voltage is applied) and the transparent electrode 9 that forms the upper layer is used as a common electrode (to which either a common voltage or a counter voltage is applied). At least one slit is cut through the transparent electrode 9. An FFS mode liquid crystal display device 500 with such a configuration is disclosed in Japanese Laid-Open Patent Publication No. 2011-53443, for example, the entire disclosure of which is hereby incorporated by reference.

This liquid crystal display device 500 includes a TFT substrate 100A, a counter substrate 200, and a liquid crystal layer 150 interposed between the TFT substrate 100A and the counter substrate 200. In this liquid crystal display device 500, no counter electrode such as a transparent electrode of ITO, for example, is arranged on the surface of the counter substrate 200 to face the liquid crystal layer 150. Instead, a display operation is carried out by controlling the alignments of liquid crystal molecules in the liquid crystal layer 150 with a lateral electric field which is generated by the conductor region (pixel electrode) 55 and the transparent electrode (common electrode) 9 that are formed on the TFT substrate 100A.

Hereinafter, a method for fabricating this TFT substrate 100A will be described.

A method for fabricating a semiconductor device 100A according to an embodiment of the present invention includes the steps of: (A) providing a substrate 2; (B) forming a gate electrode 3 and a gate insulating layer 4 on the substrate 2; (C) forming an oxide semiconductor film on the gate insulating layer 4, forming a reducing insulating film with the property of reducing an oxide semiconductor included in the oxide semiconductor film on the oxide semiconductor film, and patterning the oxide semiconductor film and the reducing insulating film using a single photomask, thereby forming an oxide semiconductor layer 50 and a reducing insulating layer 61 which contacts with a portion of the upper surface of the oxide semiconductor layer 50, so that a portion of the oxide semiconductor layer 50 that contacts with the reducing insulating layer 61 has its resistance lowered to turn into a conductor region 55 and another portion of the oxide semiconductor layer that has not had its resistance lowered becomes a semiconductor region 51; and (D) forming, either before or after the step (C), source and drain electrodes 6s, 6d to be electrically connected to the semiconductor region 51.

This is a simplified method for fabricating a semiconductor device, and therefore, can contribute to cutting down the manufacturing cost.

The step (D) may be performed after the step (C), the source and drain electrodes 6s, 6d may be formed on the semiconductor region 51, and a portion of the drain electrode 6d may be formed on the reducing insulating layer 61.

Alternatively, the step (D) may be performed before the step (C), and the oxide semiconductor layer 50 may be formed on the source and drain electrodes 6s, 6d.

Figure 4:
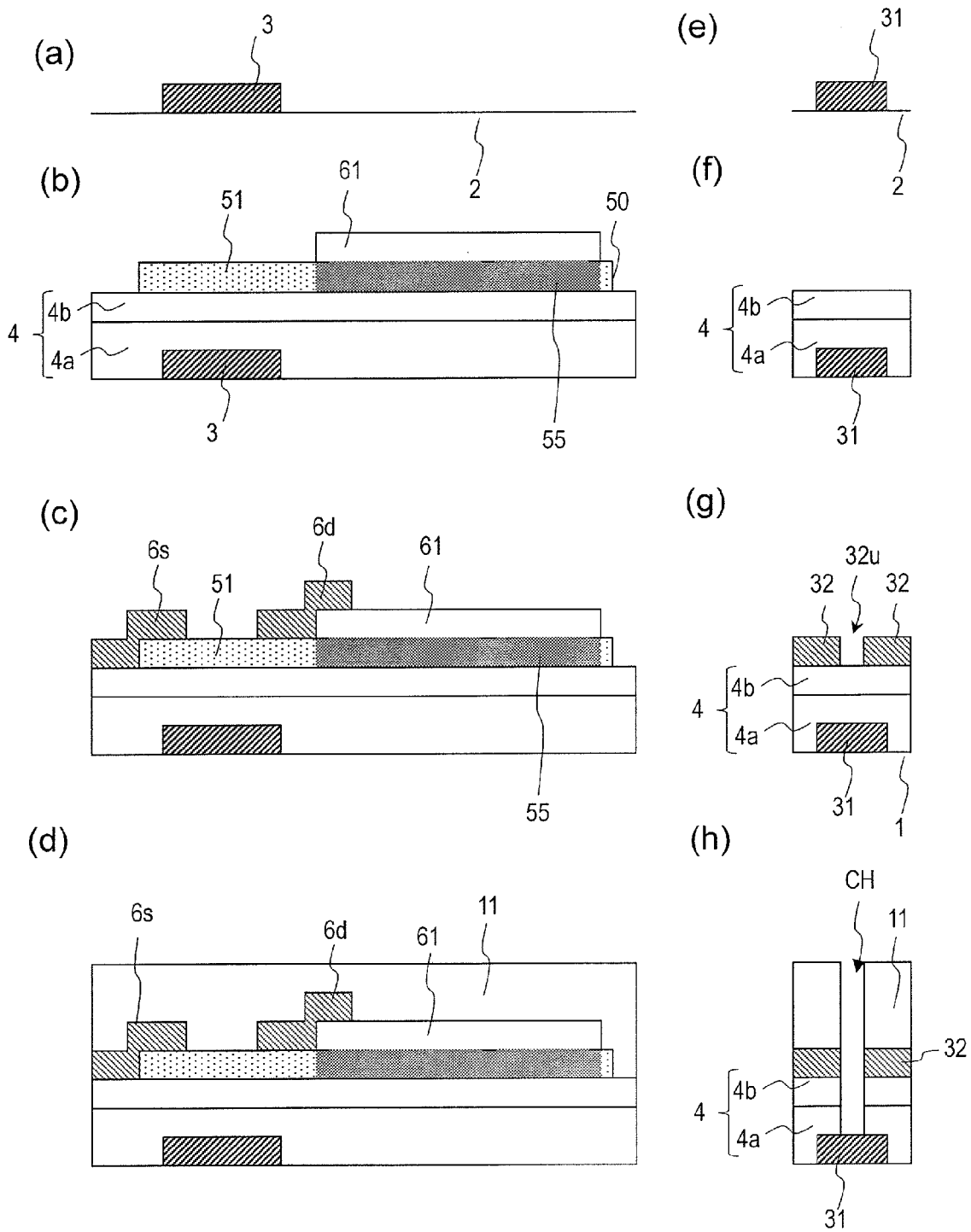
[FIG. 4] (a) through (h) are schematic cross-sectional views illustrating an exemplary method for fabricating the TFT substrate 100A according to the embodiment of the present invention.

Hereinafter, an exemplary method for fabricating the TFT substrate 100A will be described in detail with reference to FIG. 4.

FIG. 4(a) through 4(h) are schematic cross-sectional views illustrating an exemplary method for fabricating the TFT substrate 100A. More specifically, FIGS. 4(a) through 4(d) are schematic cross-sectional views illustrating an exemplary method for fabricating a TFT, while FIG. 4(e) through 4(h) are schematic cross-sectional views illustrating an exemplary method for forming a source-gate connecting portion.

First of all, as shown in FIGS. 4(a) and 4(e), a gate electrode 3 and a gate connecting layer 31 to be made of the same conductive film as the gate electrode 3 are formed on a substrate 2. As the substrate 2, a transparent insulating substrate such as a glass substrate, for example, may be used. The gate electrode 3 and the gate connecting layer 31 may be formed by depositing a conductive film on the substrate 2 by sputtering process and then patterning the conductive film by photolithographic process. In this example, a multilayer film with a double layer structure consisting of a TaN film (with a thickness of about 50 nm) and a W film (with a thickness of about 370 nm) that have been stacked one upon the other in this order on the substrate 2 is used as the conductive film. As this first conductive film, a single-layer film of Ti, Mo, Ta, W, Cu, Al or Cr, a multilayer film or alloy film including any of these elements in combination, or a metal nitride film thereof may be used.

Next, as shown in FIGS. 4(b) and 4(f), a lower gate insulating layer 4a and an upper gate insulating layer 4b are formed by CVD (chemical vapor deposition) process to cover the gate electrode 3 and the gate connecting layer 31. In this example, the lower gate insulating layer 4a is formed out of an $SiN_x$ film (with a thickness of about 325 nm) and the upper gate insulating layer 4b is formed out of an $SiO_2$ film (with a thickness of about 50 nm). The upper gate insulating layer 4b may be made of $SiO_2$, $SiO_xN_y$ (silicon oxynitride, where x>y), $SiN_xO_y$ (silicon nitride oxide, where x>y), $Al_2O_3$, or $Ta_2O_5$, for example. The lower gate insulating layer 4a may be made of $SiN_x$, $SiO_2$, $SiO_xN_y$ (silicon oxynitride, where x>y), $SiN_xO_y$ (silicon nitride oxide, where x>y), $Al_2O_3$, or $Ta_2O_5$, for example.

Subsequently, an oxide semiconductor film (not shown) is formed by sputtering process on the gate insulating layer 4. As the oxide semiconductor film, an In—Ga—Zn—O based semiconductor film may be used, for example. The oxide semiconductor film may have a thickness of about 50 nm.

Subsequently, a reducing insulating film (not shown) with the property of reducing an oxide semiconductor included in the oxide semiconductor film is formed by CVD process, for example. An $SiN_x$ film may be used as the reducing insulating film. The reducing insulating film may have a thickness of about 100 nm, for example.

The reducing insulating film is deposited under the condition including a substrate temperature of about 100° C. to about 250° C. (e.g., about 220° C.) and an $SiH_4/NH_3$ mixed gas flow rate ratio (i.e., the ratio of the $SiH_4$ flow rate to the $NH_3$ flow rate) of 4 to 20.

Thereafter, by performing a half-tone exposure process, a resist film (not shown) with varying thicknesses is formed on the reducing insulating film using a single photomask. After that, the reducing insulating film and the oxide semiconductor film are patterned by dry etching and ashing processes, for example, into their intended patterns, thereby forming an oxide semiconductor layer 50 and a reducing insulating layer 61. In this process step, the reducing insulating layer 61 is formed so as not to contact with a portion of the oxide semiconductor layer 50 that will be a channel region.

Since the oxide semiconductor layer 50 and the reducing insulating layer 61 can be formed by performing a half-tone exposure process using a single photomask, the manufacturing cost can be cut down compared to a situation where the oxide semiconductor layer 50 and the reducing insulating layer 61 are formed using two separate masks. In the region illustrated in FIG. 4(f), however, neither the oxide semiconductor layer 50 nor the reducing insulating layer 61 is formed.

A portion of the oxide semiconductor layer 50 which contacts with the reducing insulating layer 61 is reduced by hydrogen, for example, included in the reducing insulating layer 61 and turns into a conductor region 55. Meanwhile, the rest of the oxide semiconductor layer 50 which has not had its resistance lowered turns into a semiconductor region 51. As a result, the conductor region 55 can be formed even without performing any special resistance lowering process (such as a hydrogen plasma process), and therefore, the manufacturing cost can be cut down.

In addition, another portion of the oxide semiconductor layer 50 which is located under the drain electrode 6d to be described later may also have its resistance lowered by hydrogen diffusing and may form part of the conductor region 55, too.

Thereafter, as shown in FIG. 4(c), source and drain electrodes 6s and 6d are formed by sputtering process, for example, on the semiconductor region 51. A portion of the drain electrode 6s may be formed on the reducing insulating layer 61. Meanwhile, in the region illustrated in FIG. 4(g), a source connecting layer 32 is formed on the upper gate insulating layer 4b. A hole 32u is cut through the source connecting layer 32 so as to overlap with the gate connecting layer 32 when viewed along a normal to the substrate 2. The source electrode 6s, drain electrode 6d and source connecting layer 32 may have a multilayer structure consisting of Ti, Al and Ti layers. The lower Ti layer may have a thickness of about 50 nm, the Al layer may have a thickness of about 200 nm, and the upper Ti layer may have a thickness of about 100 nm.

Next, as shown in FIGS. 4(d) and 4(h), a protective layer 11 is deposited by CVD process over the source electrode 6s, drain electrode 6d, source connecting layer 32 and reducing insulating layer 61. The protective layer 11 may be made of $SiO_2$, for example. The protective layer 11 may have a thickness of about 265 nm. A hole has been cut through a portion of the protective layer 11 shown in FIG. 4(h) so as to overlap with the hole 32u when viewed along a normal to the substrate, thereby creating a contact hole CH to the gate connecting layer 31.

Optionally, after the protective layer 11 has been formed, a heat treatment (annealing process) may be carried out at a temperature (of about 300° C., for example) that is equal to or higher than the deposition temperature at which the protective layer 11 has been deposited. By conducting the heat treatment, hydrogen included in the reducing insulating layer 61 can be diffused through a portion of the oxide layer 50 which contacts with the reducing insulating layer 61 and the electrical resistance of the conductor region 55 can be further lowered.

Subsequently, as shown in FIG. 1(b), a transparent conductive film is deposited by sputtering process, for example, over the protective layer 11 and then patterned, thereby forming a transparent electrode 9. At least a portion of the transparent electrode 9 overlaps with the conductor region 55 with the protective layer 11 interposed between them. Meanwhile, as shown in FIG. 1(c), a transparent connecting layer 33 is also formed out of the same conductive film as the transparent electrode 9. Inside the contact hole CH, the transparent connecting layer 33 contacts with the source connecting layer 32 and the gate connecting layer 31, thereby electrically connecting together the source connecting layer 32 and the gate connecting layer 31. The transparent electrode 9 and transparent connecting layer 33 may be made of ITO, for example, and may have a thickness of about 100 nm.

Figure 5:
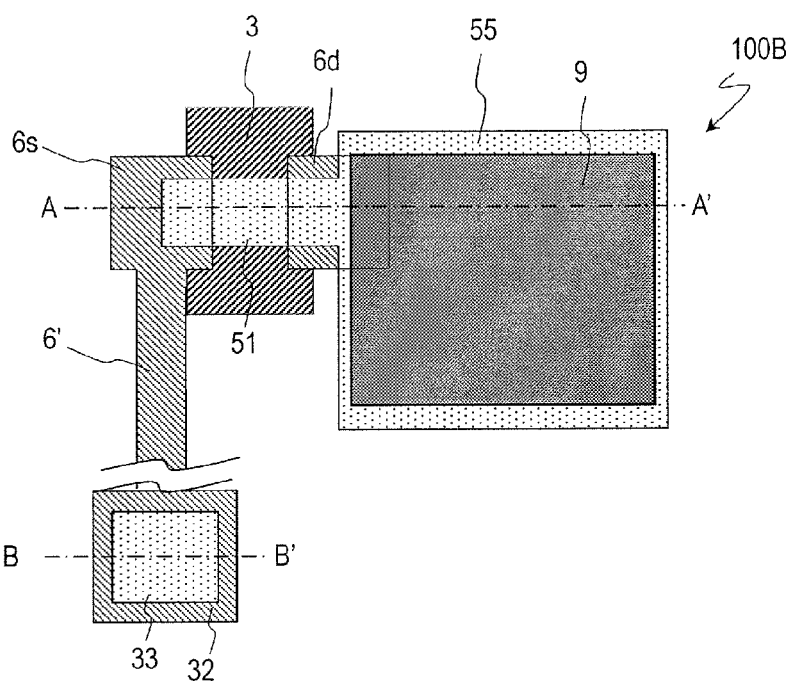
[FIG. 5] (a) is a schematic plan view illustrating a TFT substrate 100B according to another embodiment of the present invention. (b) is a schematic cross-sectional view of the TFT substrate 100B as viewed on the plane A-A' shown in (a). And (c) is a schematic cross-sectional view of the TFT substrate 100B as viewed on the plane B-B' shown in (a).
Figure 5:
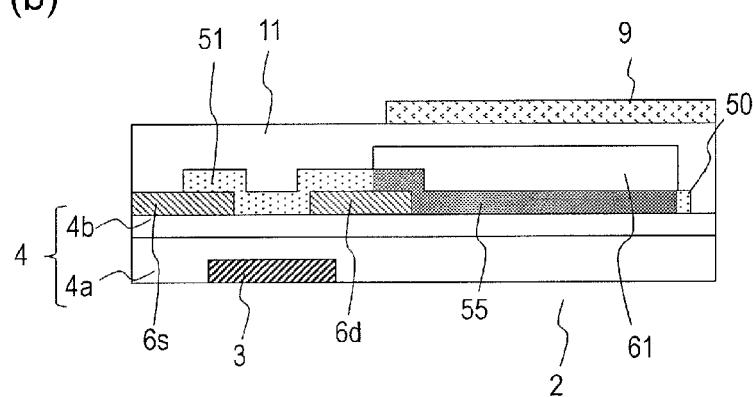
Figure 5:
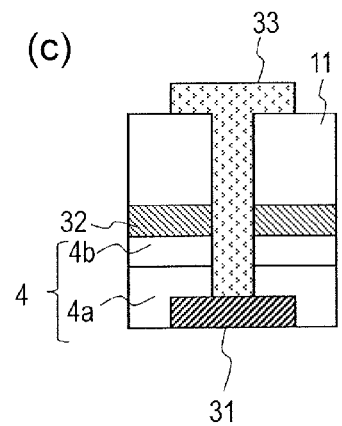

Hereinafter, a TFT substrate 100B as another embodiment of the present invention will be described with reference to FIG. 5. FIG. 5(a) is a schematic plan view of the TFT substrate 100B. FIG. 5(b) is a schematic cross-sectional view of the TFT substrate 100B as viewed on the plane A-A' shown in FIG. 5(a). And FIG. 5(c) is a schematic cross-sectional view of the TFT substrate 100B as viewed on the plane B-B' shown in FIG. 5(a). In FIG. 5, any component also included in the TFT substrate 100A and having substantially the same function as its counterpart is identified by the same reference numeral as its counterpart's and description thereof will be omitted herein to avoid redundancies.

In the TFT substrate 100B shown in FIGS. 5(a) to 5(c), the upper surface of the source and drain electrodes 6s and 6d is in contact with the semiconductor region 51 (oxide semiconductor layer 50), which is a difference from the TFT substrate 100A. Just like the TFT substrate 100A, this TFT substrate 100B may also be used in the liquid crystal display device 500 shown in FIG. 3, for example.

This TFT substrate 100B is fabricated by the manufacturing process to be described below. Although it will be described in detail later how to fabricate the TFT substrate 100B, the damage to be done on the oxide semiconductor layer 50 (on the semiconductor region 51, in particular) by forming the source and drain electrodes 6s and 6d can be reduced, because the oxide semiconductor layer 50 is formed after the source and drain electrodes 6s and 6d have been formed.

Figure 6:
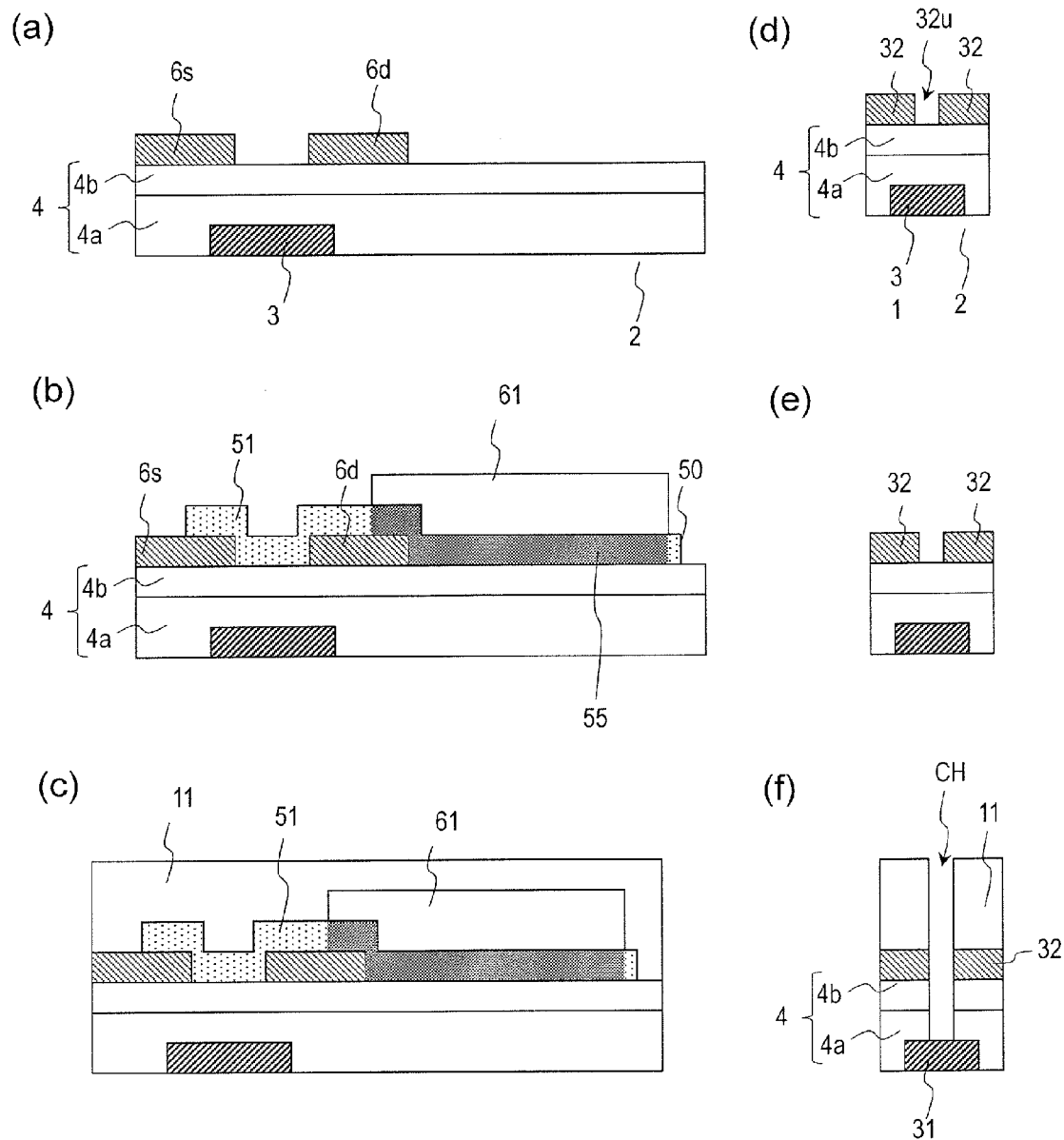
[FIG. 6] (a) through (f) are schematic cross-sectional views illustrating an exemplary method for fabricating the TFT substrate 100B according to that another embodiment of the present invention.

Hereinafter, an exemplary method for fabricating the TFT substrate 100B will be described in detail with reference to FIG. 6. FIG. 6(a) through 6(f) are schematic cross-sectional views illustrating an exemplary method for fabricating the TFT substrate 100B. More specifically, FIG. 6(a) through 6(c) are schematic cross-sectional views illustrating an exemplary method for fabricating a TFT, while FIG. 6(d) through 6(f) are schematic cross-sectional views illustrating an exemplary method for forming a source-gate connecting portion.

First of all, a gate electrode 3, a gate connecting layer 31 and a gate insulating layer 4 are formed on a substrate 2 as described above.

Next, as shown in FIG. 6(a), a source electrode 6s and a drain electrode 6d are formed on the gate insulating layer 4 by the method described above. Meanwhile, in the region illustrated in FIG. 6(d), a source connecting layer 32 with a hole 32u is formed by the method described above.

Subsequently, an oxide semiconductor film (not shown) is formed on the source and drain electrodes 6s and 6d by the method described above.

Then, a reducing insulating film (not shown) is formed on the oxide semiconductor film by the method described above.

Thereafter, by performing a half-tone exposure process, a resist film (not shown) with varying thicknesses is formed on the reducing insulating film using a single photomask. After that, the reducing insulating film and the oxide semiconductor film are patterned by dry etching and asking processes, for example, into their intended patterns, thereby forming an oxide semiconductor layer 50 and a reducing insulating layer 61. In this process step, the reducing insulating layer 61 is formed so as not to contact with a portion of the oxide semiconductor layer 50 that will be a channel region.

Since the oxide semiconductor layer 50 and the reducing insulating layer 61 can be formed by performing a half-tone exposure process using a single photomask, the manufacturing cost can be cut down compared to a situation where the oxide semiconductor layer 50 and the reducing insulating layer 61 are formed using two separate masks. In the region illustrated in FIG. 6(e), however, neither the oxide semiconductor layer 50 nor the reducing insulating layer 61 is formed.

A portion of the oxide semiconductor layer 50 which contacts with the reducing insulating layer 61 is reduced by hydrogen, for example, included in the reducing insulating layer 61 and turns into a conductor region 55. Meanwhile, the rest of the oxide semiconductor layer 50 which has not had its resistance lowered turns into a semiconductor region 51. As a result, the conductor region 55 can be formed even without performing any special resistance lowering process (such as a hydrogen plasma process), and therefore, the manufacturing cost can be cut down.

In addition, another portion of the oxide semiconductor layer 50 which is located under the drain electrode 6d may also have its resistance lowered by hydrogen diffusing and may form part of the conductor region 55, too.

Next, as shown in FIGS. 6(c) and 6(f), a protective layer 11 is deposited by CVD process over the semiconductor region 51 and reducing insulating layer 61. The protective layer 11 may be made of $SiO_2$, for example. The protective layer 11 may have a thickness of about 265 nm. A hole has been cut through a portion of the protective layer 11 shown in FIG. 6(f) so as to overlap with the hole 32u when viewed along a normal to the substrate, thereby creating a contact hole CH to the gate connecting layer 31.

Subsequently, as shown in FIG. 5(b), a transparent conductive film is deposited by sputtering process, for example, over the protective layer 11 and then patterned, thereby forming a transparent electrode 9. At least a portion of the transparent electrode 9 overlaps with the conductor region 55 with the protective layer 11 interposed between them. Meanwhile, as shown in FIG. 5(c), a transparent connecting layer 33 is also formed out of the same conductive film as the transparent electrode 9. Inside the contact hole CH, the transparent connecting layer 33 contacts with the source connecting layer 32 and the gate connecting layer 31, thereby electrically connecting the source connecting layer 32 and the gate connecting layer 31 together.

As can be seen from the foregoing description, embodiments of the present invention provide a semiconductor device which contributes to making a display panel of high display quality at a reduced manufacturing cost and also provide a method for fabricating such a semiconductor device.

INDUSTRIAL APPLICABILITY

The present invention is applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 2 substrate
3 gate electrode
4 gate insulating layer
4a lower gate insulating layer
4b upper gate insulating layer
6s source electrode
6d drain electrode
9 transparent electrode
50 oxide layer
51 semiconductor region
55 conductor region
11 protective layer
31 gate insulating layer
32 source connecting layer
61 reducing insulating layer
100A semiconductor device (TFT substrate)
CH contact hole

The invention claimed is:

1. A semiconductor device comprising:
    a substrate;
    a gate electrode formed on the substrate;
    a gate insulating layer formed on the gate electrode;
    an oxide layer which is formed on the gate insulating layer and which includes a semiconductor region and a conductor region, wherein the semiconductor region overlaps at least partially with the gate electrode with the gate insulating layer interposed between them;
    source and drain electrodes electrically connected to the semiconductor region;
    a protective layer formed on the source and drain electrodes; and
    a transparent electrode formed on the protective layer,
    wherein at least part of the transparent electrode overlaps with the conductor region with the protective layer interposed between them,
    the upper surface of the conductor region contacts with a reducing insulating layer with the property of reducing an oxide semiconductor included in the oxide layer, and
    the reducing insulating layer is out of contact with a channel region of the semiconductor region.

2. The semiconductor device of claim 1, wherein the source and drain electrodes are formed on the semiconductor region, and
    a portion of the drain electrode is formed on the reducing insulating layer.

3. The semiconductor device of claim 1, wherein the source and drain electrodes are formed under the semiconductor region.

4. The semiconductor device of claim 1, further comprising a source-gate connecting portion, which includes:
    a gate connecting layer formed out of the same conductive film as the gate electrode;
    a source connecting layer formed out of the same conductive film as the source electrode; and
    a transparent connecting layer formed out of the same transparent conductive film as the transparent electrode,
    wherein the source connecting layer and the gate connecting layer are electrically connected together via the transparent connecting layer.

5. The semiconductor device of claim 1, wherein the oxide layer includes In, Ga and Zn.

6. A method for fabricating a semiconductor device, the method comprising the steps of:
    (A) providing a substrate;
    (B) forming a gate electrode and a gate insulating layer on the substrate;
    (C) forming an oxide semiconductor film on the gate insulating layer, forming a reducing insulating film with the property of reducing an oxide semiconductor included in the oxide semiconductor film on the oxide semiconductor film, and
    patterning the oxide semiconductor film and the reducing insulating film using a single photomask, thereby forming an oxide semiconductor layer and a reducing insulating layer which contacts with a portion of the upper surface of the oxide semiconductor layer,
    so that a portion of the oxide semiconductor layer that contacts with the reducing insulating layer has its resistance lowered to turn into a conductor region and another portion of the oxide semiconductor layer that has not had its resistance lowered becomes a semiconductor region; and
    (D) forming, either before or after the step (C), source and drain electrodes to be electrically connected to the semiconductor region.

7. The method of claim 6, wherein the step (D) is performed after the step (C), the source and drain electrodes are formed on the semiconductor region, and a portion of the drain electrode is formed on the reducing insulating layer.

8. The method of claim 6, wherein the step (D) is performed before the step (C), and the oxide semiconductor layer is formed on the source and drain electrodes.

* * * * *